United States Patent
Stancel (10) Patent No.: US 8,536,442 B2
(45) Date of Patent: Sep. 17, 2013

(54) SLIDABLE MOUNTING SYSTEM FOR SOLAR MODULES

(75) Inventor: Robert Stancel, Los Altos, CA (US)

(73) Assignee: Nanosolar, Inc., San Jose, CA (US)

( * ) Notice: Subject to any disclaimer, the term of this patent is extended or adjusted under 35 U.S.C. 154(b) by 339 days.

(21) Appl. No.: 12/203,093

(22) Filed: Sep. 2, 2008

(65) Prior Publication Data

US 2009/0114271 A1   May 7, 2009

Related U.S. Application Data (60) Provisional application No. 60/969,642, filed on Sep. 2, 2007.

(51) Int. Cl.
  *H02N 6/00* (2006.01)
  *H01L 31/042* (2006.01)
  *H01L 31/00* (2006.01)

(52) U.S. Cl.
  USPC .......................................... 136/251; 136/259

(58) Field of Classification Search
  USPC ................... 136/251, 259; 52/173.3
  See application file for complete search history.

(56) References Cited

U.S. PATENT DOCUMENTS

| | | | |
|---|---|---|---|
| 1,682,442 A | 8/1928 | Thomas | |
| 3,286,516 A | 11/1966 | Post | |
| 3,539,234 A | 11/1970 | Rapata | |
| 3,815,303 A | 6/1974 | Ziegler | |
| 3,880,396 A | 4/1975 | Freiberger et al. | |
| 4,306,540 A | 12/1981 | Hutchison | |
| 4,371,139 A | 2/1983 | Clark | |
| 4,404,962 A | 9/1983 | Zinn et al. | |
| 4,409,758 A | 10/1983 | Dickerson et al. | |
| 4,637,178 A | 1/1987 | Nimmo et al. | |
| 5,112,408 A * | 5/1992 | Melchior | 136/251 |
| 5,252,141 A | 10/1993 | Inoue et al. | |
| 5,460,660 A | 10/1995 | Albright et al. | |
| 5,678,383 A | 10/1997 | Danielewicz | |
| 5,697,192 A * | 12/1997 | Inoue | 52/173.3 |
| 5,762,720 A * | 6/1998 | Hanoka et al. | 136/251 |
| 5,768,831 A * | 6/1998 | Melchior | 52/173.3 |
| 5,986,203 A | 11/1999 | Hanoka et al. | |
| 6,046,399 A | 4/2000 | Kapner | |
| 6,093,884 A | 7/2000 | Toyomura et al. | |
| 6,170,197 B1 | 1/2001 | Tyves et al. | |
| 6,294,724 B1 | 9/2001 | Sasaoka et al. | |
| 6,338,223 B1 | 1/2002 | Stahl | |

(Continued)

FOREIGN PATENT DOCUMENTS

GB   2064756   6/1981

OTHER PUBLICATIONS

Non-Final Office Action mailed date Jan. 4, 2012 issued for U.S. Appl. No. 13/099,192.

(Continued)

*Primary Examiner* — Eli Mekhlin
(74) *Attorney, Agent, or Firm* — Joshua D. Isenberg; JDI Patent (57) ABSTRACT

Methods and devices are provided for rapid solar module installation. In one embodiment, a photovoltaic module is provided comprising of a plurality of photovoltaic cells a plurality of photovoltaic modules; at least a first type of mounting bracket in contact with the module; at least a second type of mounting bracket, wherein the brackets are configured to interlock and connect multiple modules together.

7 Claims, 10 Drawing Sheets

(56) References Cited

U.S. PATENT DOCUMENTS

| | | |
|---|---|---|
| 6,546,988 B2 | 4/2003 | Stahl |
| 6,570,084 B2 | 5/2003 | Dinwoodie |
| 6,651,388 B1 | 11/2003 | Scheck |
| 6,672,018 B2 | 1/2004 | Shingleton |
| 6,810,937 B2 | 11/2004 | Stahl |
| 6,959,517 B2 | 11/2005 | Poddany et al. |
| 7,384,209 B2 | 6/2008 | Muders et al. |
| 7,435,134 B2 | 10/2008 | Lenox |
| 7,435,897 B2 | 10/2008 | Russell |
| 7,557,291 B2 | 7/2009 | Flaherty et al. |
| 7,574,842 B2 | 8/2009 | Russell |
| 7,730,676 B2 | 6/2010 | Hon |
| 7,797,882 B2 | 9/2010 | Lubaway |
| 7,806,377 B2 | 10/2010 | Strizki |
| 8,196,360 B2 | 6/2012 | Metten et al. |
| 8,234,821 B2 | 8/2012 | Plaisted et al. |
| 8,256,169 B2 | 9/2012 | Cusson et al. |
| 2005/0115176 A1 | 6/2005 | Russell |
| 2005/0126622 A1 | 6/2005 | Mukai et al. |
| 2006/0048452 A1 | 3/2006 | Sweeney et al. |
| 2008/0040990 A1 | 2/2008 | Vendig et al. |
| 2008/0149169 A1 | 6/2008 | Flaherty et al. |
| 2009/0114270 A1 | 5/2009 | Stancel |
| 2009/0242014 A1 | 10/2009 | Leary |
| 2009/0266352 A1 | 10/2009 | Wetmore |
| 2010/0108113 A1 | 5/2010 | Taggart et al. |
| 2010/0154784 A1 | 6/2010 | King et al. |
| 2010/0218441 A1 | 9/2010 | Stancel et al. |
| 2010/0233157 A1 | 9/2010 | Osorio et al. |
| 2010/0236610 A1 | 9/2010 | Stancel et al. |
| 2010/0263296 A1 | 10/2010 | Jones |
| 2010/0276558 A1 | 11/2010 | Faust et al. |
| 2010/0307991 A1 | 12/2010 | Belikoff et al. |
| 2011/0253190 A1 | 10/2011 | Farnham, Jr. |

OTHER PUBLICATIONS

Final Office Action mailed date Sep. 25, 2012 issued for U.S. Appl. No. 13/099,192.

Non-Final Office action mailed date Feb. 29, 2012, issue for U.S. Appl. No. 12/483,226.

Non-Final Office action mailed date Mar. 24, 2011, issued for U.S. Appl. No. 12/483,226.

Final Office action mailed date Oct. 12, 2012, issued for U.S. Appl. No. 12/483,226.

Final Office action mailed date Oct. 17, 2011, issued for U.S. Appl. No. 12/483,226.

U.S. Appl. No. 12/483,226, inventor Robert Stance, filed Jun. 11, 2009.

U.S. Appl. No. 13/099,192, inventor Robert Stance, filed May 2, 2011.

Notice of Allowance mailed date May 2, 2013, issued for U.S. Appl. No. 12/483,226, entitled Solar Module Mounting Apparatus Allowing for at Least One Degree of Freedom.

\* cited by examiner

SLIDABLE MOUNTING SYSTEM FOR SOLAR MODULES

CROSS-REFERENCE TO RELATED APPLICATION

The application claims priority to U.S. Provisional Application Ser. No. 60/969,642 filed Sep. 2, 2007, fully incorporated herein by reference for all purposes.

FIELD OF THE INVENTION

This invention relates generally to photovoltaic devices, and more specifically, to solar cells and/or solar cell modules designed for rapid mounting and installation.

BACKGROUND OF THE INVENTION

Solar cells and solar cell modules convert sunlight into electricity. Traditional solar cell modules are typically comprised of polycrystalline and/or monocrystalline silicon solar cells mounted on a support with a rigid glass top layer to provide environmental and structural protection to the underlying silicon based cells. This package is then typically mounted in a rigid aluminum or metal frame that supports the glass and provides attachment points for securing the solar module to the installation site. A host of other materials are also included to make the solar module functional. This may include junction boxes, bypass diodes, sealants, and/or multi-contact connectors used to complete the module and allow for electrical connection to other solar modules and/or electrical devices. Certainly, the use of traditional silicon solar cells with conventional module packaging is a safe, conservative choice based on well understood technology.

Drawbacks associated with traditional solar module package designs, however, have limited the ability to install large numbers of solar panels in a cost-effective manner. This is particularly true for large scale deployments where it is desirable to have large numbers of solar modules setup in a defined, dedicated area. Traditional solar module packaging comes with a great deal of redundancy and excess equipment cost. For example, a recent installation of conventional solar modules in Pocking, Germany deployed 57,912 monocrystalline and polycrystalline-based solar modules. This meant that there were also 57,912 junction boxes, 57,912 aluminum frames, untold meters of cablings, and numerous other components. These traditional module designs inherit a large number of legacy parts that hamper the ability of installers to rapidly and cost-efficiently deploy solar modules at a large scale. In addition to the redundancy of equipment, the types of module mounting brackets used to secure the modules to ground or roof supports increases the time and difficulty associated with module installation.

Although subsidies and incentives have created some large solar-based electric power installations, the potential for greater numbers of these large solar-based electric power installations has not been fully realized. There remains substantial improvement that can be made to photovoltaic cells and photovoltaic modules that can greatly increase their ease of installation, and create much greater market penetration and commercial adoption of such products.

SUMMARY OF THE INVENTION

Embodiments of the present invention address at least some of the drawbacks set forth above. The present invention provides for the improved solar module designs that reduce manufacturing costs and cumbersome mounting hardware for each module. These improved module designs are well suited for rapid installation. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. At least some of these and other objectives described herein will be met by various embodiments of the present invention.

Although not limited to the following, the embodiments of the present invention provides a rapid mounting system wherein the modules may have pre-mounted structure that slidably engage a support member attached to the support surface or the ground. The structure may be a bracket or some molded or shaped portion of the module (intregrally formed with the module or added separately). Slidable engagement allows for reduced mounting time. Using clips, rapid release clamps or the like may also speed installation. In some embodiments, these modules may be used as building integrated material and replace items such as roofing tiles or windows, or other building materials. Optionally, the modules do not replace building materials but are used in conjunction with or over such building materials.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

Photovoltaic Module

Figure 1:
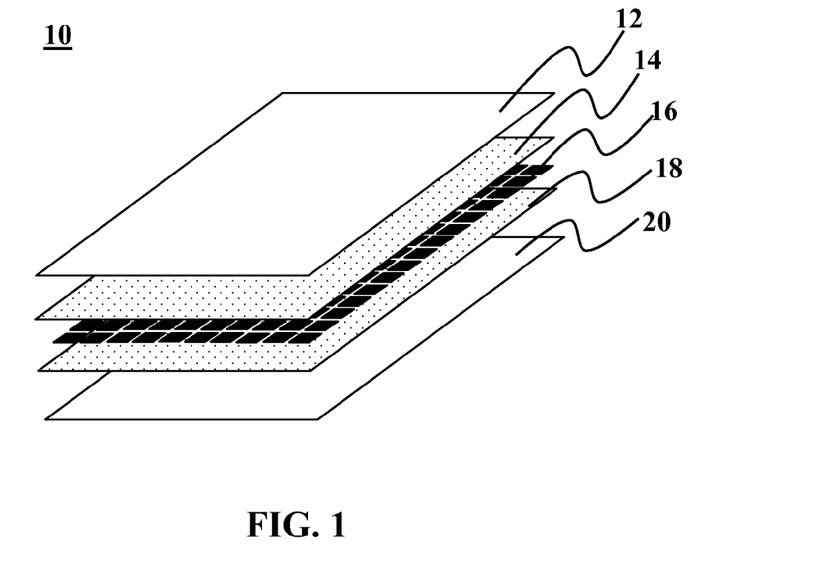
FIG. 1 is an exploded perspective view of a module according to one embodiment of the present invention.

Referring now to FIG. 1, one embodiment of a module 10 according to the present invention will now be described. Traditional module packaging and system components were developed in the context of legacy cell technology and cost economics, which had previously led to very different panel and system design assumptions than those suited for increased product adoption and market penetration. The cost structure of solar modules includes both factors that scale with area and factors that are fixed per module. Module 10 is designed to minimize fixed cost per module and decrease the incremental cost of having more modules while maintaining substantially equivalent qualities in power conversion and module durability. In this present embodiment, the module 10 may include improvements to the backsheet, frame modifications, thickness modifications, and electrical connection modifications.

FIG. 1 shows that the present embodiment of module 10 may include a rigid transparent upper layer 12 followed by a pottant layer 14 and a plurality of solar cells 16. Below the layer of solar cells 16, there may be another pottant layer 18 of similar material to that found in pottant layer 14. Beneath the pottant layer 18 may be a layer of backsheet material 20. The transparent upper layer 12 provides structural support and acts as a protective barrier. By way of nonlimiting example, the transparent upper layer 12 may be a glass layer comprised of materials such as conventional glass, solar glass, high-light transmission glass with low iron content, standard light transmission glass with standard iron content, anti-glare finish glass, glass with a stippled surface, fully tempered glass, heat-strengthened glass, annealed glass, or combinations thereof. The total thickness of the glass or multi-layer glass may be in the range of about 2.0 mm to about 13.0 mm, optionally from about 2.8 mm to about 12.0 mm. In one embodiment, the top layer 12 has a thickness of about 3.2 mm. In another embodiment, the backlayer 20 has a thickness of about 2.0 mm. As a nonlimiting example, the pottant layer 14 may be any of a variety of pottant materials such as but not limited to TEFZEL®, ethyl vinyl acetate (EVA), polyvinyl butyral (PVB), ionomer, silicone, thermoplastic polyurethane (TPU), thermoplastic elastomer polyolefin (TPO), tetrafluoroethylene hexafluoropropylene vinylidene (THV), fluorinated ethylene-propylene (FEP), saturated rubber, butyl rubber, thermoplastic elastomer (TPE), flexibilized epoxy, epoxy, amorphous polyethylene terephthalate (PET), urethane acrylic, acrylic, other fluoroelastomers, other materials of similar qualities, or combinations thereof. Optionally, some embodiments may have more than two pottant layers. The thickness of a pottant layer may be in the range of about 10 microns to about 1000 microns, optionally between about 25 microns to about 500 microns, and optionally between about 50 to about 250 microns. Others may have only one pottant layer (either layer 14 or layer 16). In one embodiment, the pottant layer 14 is about 75 microns in cross-sectional thickness. In another embodiment, the pottant layer 14 is about 50 microns in cross-sectional thickness. In yet another embodiment, the pottant layer 14 is about 25 microns in cross-sectional thickness. In a still further embodiment, the pottant layer 14 is about 10 microns in cross-sectional thickness. The pottant layer 14 may be solution coated over the cells or optionally applied as a sheet that is laid over cells under the transparent module layer 12.

It should be understood that the simplified module 10 is not limited to any particular type of solar cell. The solar cells 16 may be silicon-based or non-silicon based solar cells. By way of nonlimiting example the solar cells 16 may have absorber layers comprised of silicon (monocrystalline or polycrystalline), amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, micro-particles, nano-particles, or quantum dots. Advantageously, thin-film solar cells have a substantially reduced thickness as compared to silicon-based cells. The decreased thickness and concurrent reduction in weight allows thin-film cells to form modules that are significantly thinner than silicon-based cells without substantial reduction in structural integrity (for modules of similar design).

The pottant layer 18 may be any of a variety of pottant materials such as but not limited to EVA, TEFZEL®, PVB, ionomer, silicone, TPU, TPO, THV, FEP, saturated rubber, butyl rubber, TPE, flexibilized epoxy, epoxy, amorphous PET, urethane acrylic, acrylic, other fluoroelastomers, other materials of similar qualities, or combinations thereof as previously described for FIG. 1. The pottant layer 18 may be the same or different from the pottant layer 14. Further details about the pottant and other protective layers can be found in commonly assigned, co-pending U.S. patent application Ser. No. 11/462,359 filed Aug. 3, 2006 and fully incorporated herein by reference for all purposes. Further details on a heat sink coupled to the module can be found in commonly assigned, co-pending U.S. patent application Ser. No. 11/465,783 filed Aug. 18, 2006 and fully incorporated herein by reference for all purposes.

Figure 2:
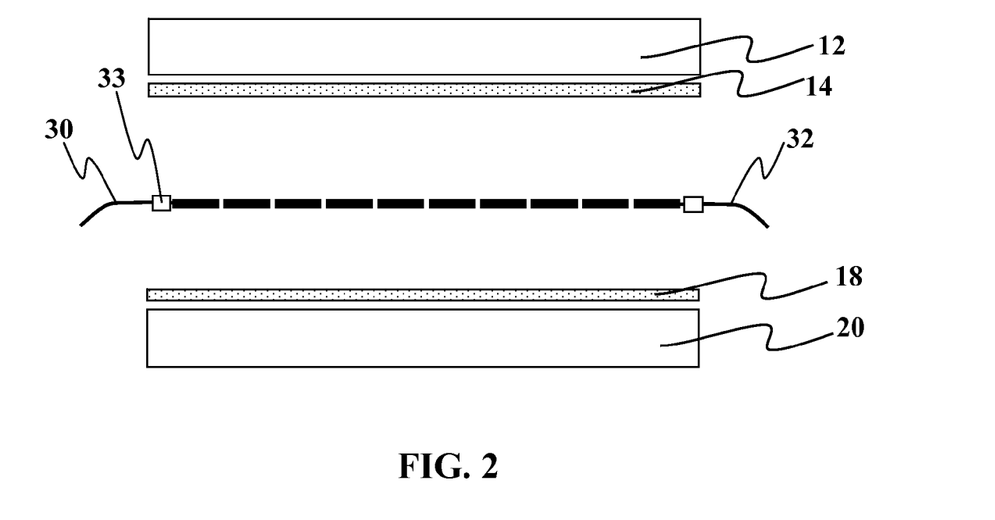
FIG. 2 shows a cross-sectional view of a module according to one embodiment of the present invention.

FIG. 2 shows a cross-sectional view of the module of FIG. 1. By way of nonlimiting example, the thicknesses of backsheet 20 may be in the range of about 10 microns to about 1000 microns, optionally about 20 microns to about 500 microns, or optionally about 25 to about 250 microns. Again, as seen for FIG. 2, this embodiment of module 10 is a frameless module without a central junction box. The present embodiment may use a simplified backsheet 20 that provides protective qualities to the underside of the module 10. As seen in FIG. 1, the module may use a rigid backsheet 20 comprised of a material such as but not limited to annealed glass, heat strengthened glass, tempered glass, flow glass, cast glass, or similar materials as previously mentioned. The rigid backsheet 20 may be made of the same or different glass used to form the upper transparent module layer 12. Optionally, in such a configuration, the top sheet 12 may be a flexible top sheet such as that set forth in U.S. Patent Application Ser. No. 60/806,096 filed Jun. 28, 2006 and fully incorporated herein by reference for all purposes. In one embodiment, electrical connectors 30 and 32 may be used to electrically couple cells to other modules or devices outside the module 10. It should also be understood that moisture barrier 33 may be placed around part or all of the perimeter of the module.

Rapid Module Mounting System

Figure 3:
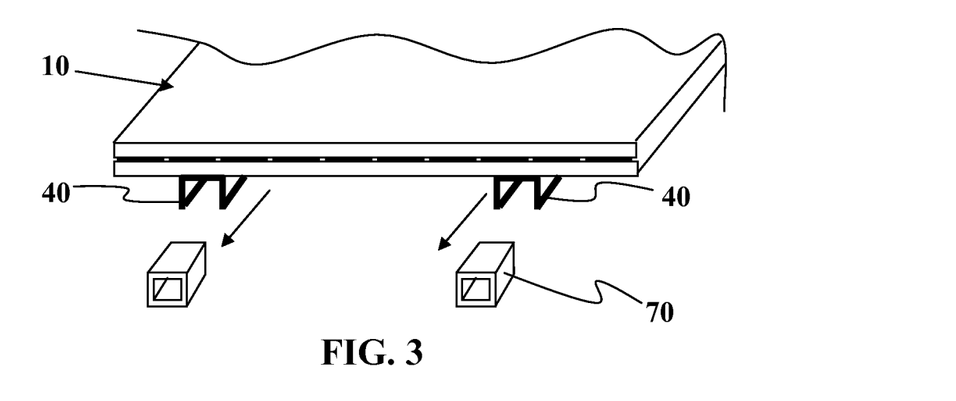
FIG. 3 shows a perspective view of how a module can engage supports rails according to one embodiment of the present invention.

Referring now to FIG. 3, one embodiment of the present invention will now be described. FIG. 3 shows a cross-sectional view of a module 10 with one embodiment of a rapid mounting system. It should be understood that thin-film, silicon, or other absorber type solar modules may be adapted for use with the present mounting system. The modules may be framed or frameless. They may use edge mounted junction box(es), a central junction box, or multiple backside junction boxes. This embodiment of the rapid mounting system comprises of a plurality of brackets 40 coupled to the module 10. The coupling may occur by various techniques and may include one or more of the following: adhesives, epoxy, mechanical retainers, screws, bolts, clamps, clips, or combinations thereof. The brackets 40 may be comprised of various materials which provide sufficient strength to hold the module 10 in place. These materials include but are not limited to metals such as aluminum, steel, stainless steel, iron, copper, tin, or combinations thereof. Any metal material may be coated with a polymer or other coating material to provide electrical insulation, surface texturing or treatment, padding, or other purpose. Optionally, the brackets 40 may be comprised of hardened polymer, fiber-filled polymer, plastic, or the like instead of or used in combination with metal. The brackets 40 may be mounted to engage an underside, side edge, and/or top side surface of the module 10. It should be understood that the brackets 40 may be glued on, melted on, integrally formed with, part of the module back sheet, etc. . . .

Rail Supports

As seen in FIG. 3, the module brackets 40 may easily slidably engage the support rail 70. In some embodiments, the rails 70 are positioned to engage the brackets 40. Optionally, the brackets are positioned under the module to accommodate the rails 70. Whichever item is fixed in position first, the corresponding item is mounted to accommodate and engage. The module may be mounted in landscape or portrait orientation over the rails 70. Optionally, there is at least one rail 70 beneath each module. In some embodiments, there are at least two rails 70 underneath the module 10. Optionally, the rails 70 are spaced so that there are at least two rails per module. Optionally, the rails 70 are spaced so that there is only one rail in contact with each module.

Figure 4A:
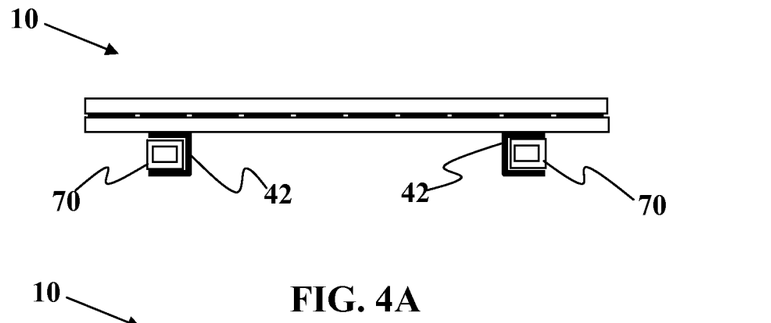
FIGS. 4A-4C show views of various bracket orientations according to embodiments of the present invention.
Figure 4B:
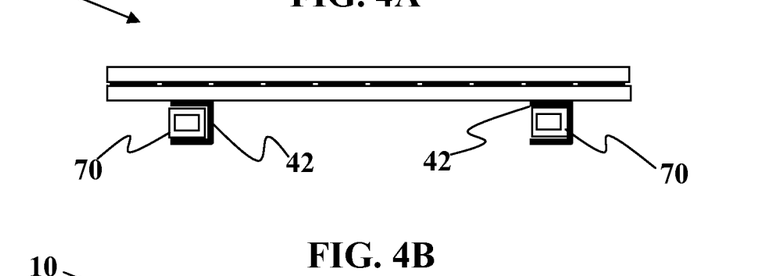
Figure 4C:
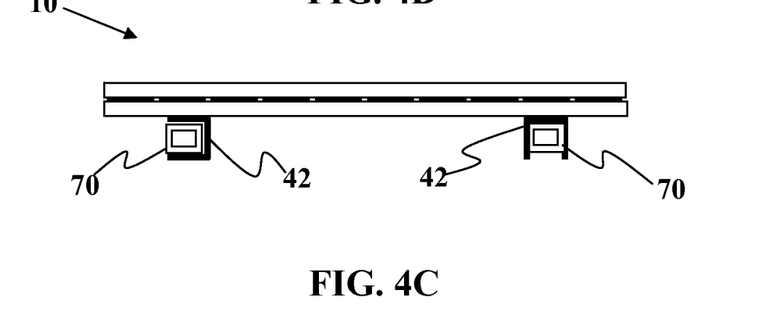

FIG. 4A shows yet another embodiment wherein the brackets are slid onto the rails 70. As seen in FIG. 4A, the brackets 42 are oriented to have their open sides pointed in different directions. This orientation provides greater support to hold the module in place from lateral forces. FIG. 4A shows that with the brackets 42 oriented in this opposing direction, the brackets 42 will need to be slid on to rails 70 in a direction parallel to the length-wise orientation of the rails 70. The rail 70 may be shorter than the module. Optionally, the rails 70 may very long (longer than one module or longer than multiple modules) and the modules may be slid thereon. It should be understood that there may be one, two, three or more rows of such brackets 40 or 42 per module. FIGS. 4B and 4C show that the brackets 40 and 42 may also be oriented in other configurations as shown.

Figure 5:
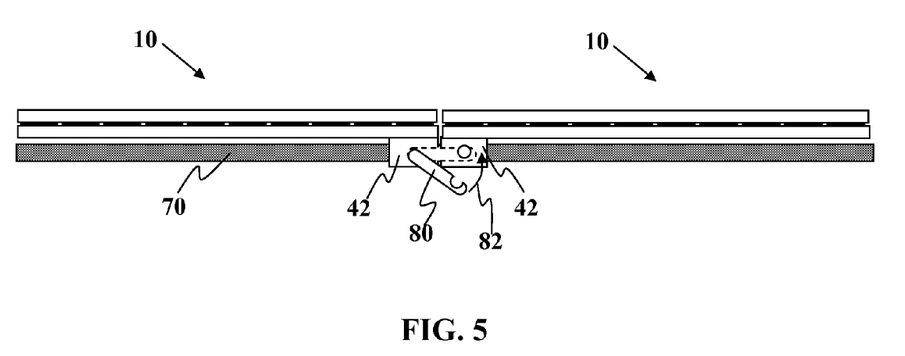
FIGS. 5 and 6 show one type of bracket interlocking device according to one embodiment of the present invention.

Referring now to FIG. 5, it is seen that that brackets 40 or 42 may be used to interlock module together. FIG. 5 shows that a latch 80 may be used with adjacent brackets 40 or 42 from different modules to bring them together and hold them in a locked configuration. FIG. 5 shows that a rotational motion as indicated by arrow 82 is used to engage a pin or receiver on a corresponding bracket. Although the present embodiment of the invention shows that latch 80 is mounted on the side of the bracket 42, other embodiments may use the latch 80 in other orientation such as but not limited to the underside or other surfaces of the bracket. Some may also use the latch to attach a bracket to some other feature on an adjacent module, not necessarily a bracket.

Figure 6:
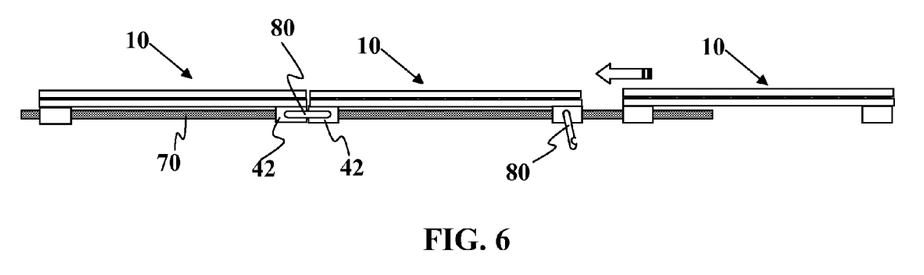

As seen in FIG. 6, once the modules 10 are coupled together by latch 80 or other device, they may be moved as unit. This allows a sliding construction system wherein one module is slid onto the rail 70, another module coupled to the first module, both modules are moved to allow a still further module to be attached, and on and on. It should also be understood that there may be stops or stop surfaces on one or more of the brackets 42 and/or on the rail 70. This surface against which adjacent brackets may contact and transfer forces between brackets. This larger contact surface prevents the brackets 40 from disengaging if the modules are shifted laterally or in other directions. Some embodiments have at least one bracket 40 with a stop surface. Optionally, some embodiments have at least two brackets 40 each with a stop surface. Optionally, some embodiments have at least three brackets 40 each with a stop surface. Optionally, some embodiments have at least four brackets 40 each with a stop surface.

Figure 7:
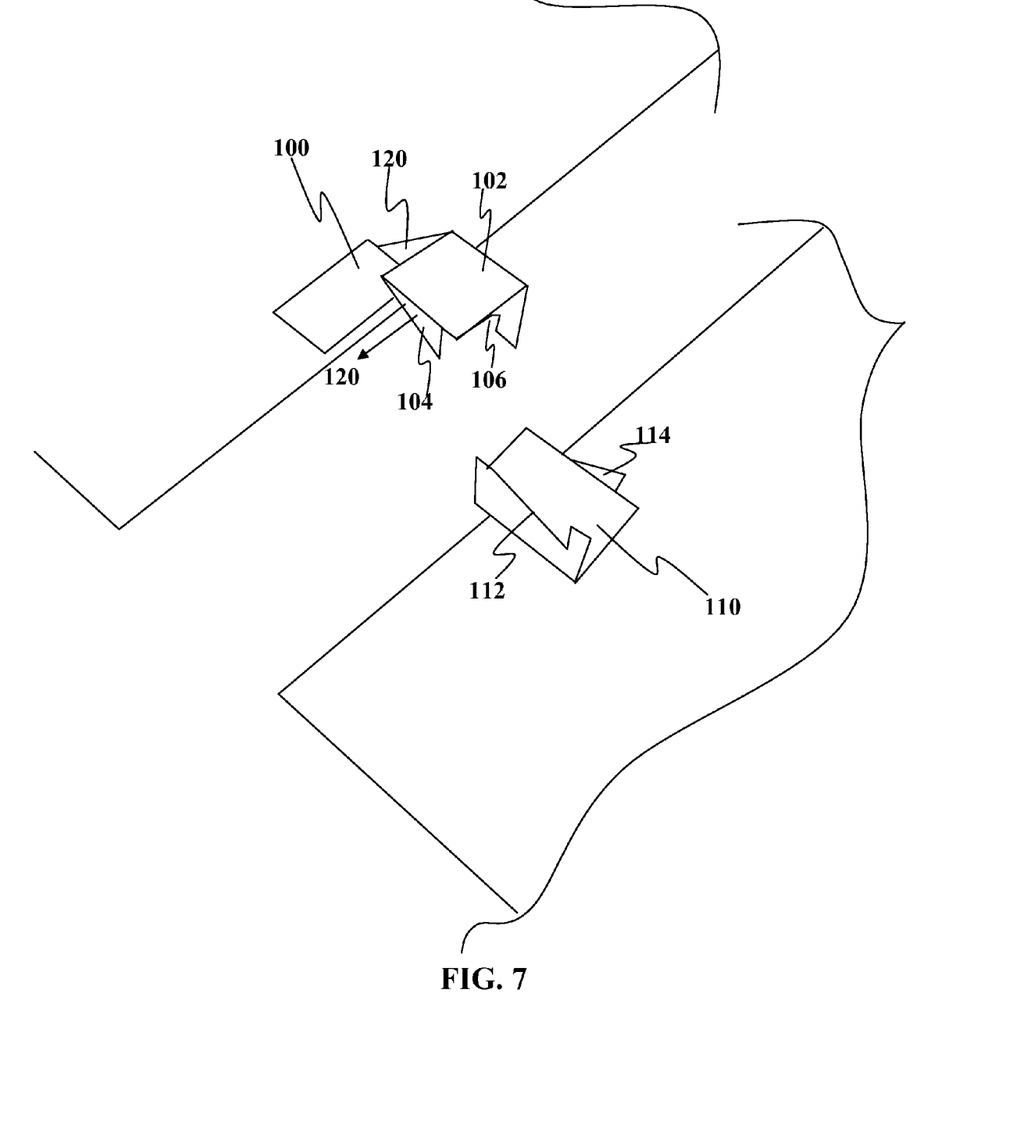
FIGS. 7 through 11 show another type of bracket interlocking device according to one embodiment of the present invention.

Referring now to FIG. 7, a still further embodiment of the present invention will now be described. This embodiments using a bracket 100 and a bracket 110 with shaped surfaces which are configured to lock against one another when the brackets are engaged together. In this manner, a separate latch 80 is optional as the brackets themselves lock against each other. FIG. 7 shows that one bracket 100 has an extended portion 102 that will extend around the underside of the rail 70. There is a protrusion 104 which will mate with a cutout 112 on the other bracket 110. Bracket 110 also has a protrusion 114 which will mate with a cutout 106 on the bracket 100. The bracket 100 has an extension piece 120 that allows the portion 102 to be placed beneath the adjacent module to engage the bracket 110 of the adjacent module. Other embodiments may have both brackets 100 and 110 with extension brackets so that they meet in the middle, instead of more under one or the other module.

FIG. 7 also shows that to engage a rail 70 (not shown for ease of illustration), the module with the bracket 100 is best placed in position by sliding the module in sideways as indicated by arrow 120. This allows the piece 104 to clear the rail and to slide the portion 102 under the rail 70. After this slide in, the brackets 100 and 110 can be engaged to match protrusions with appropriate cutouts.

Figure 8:
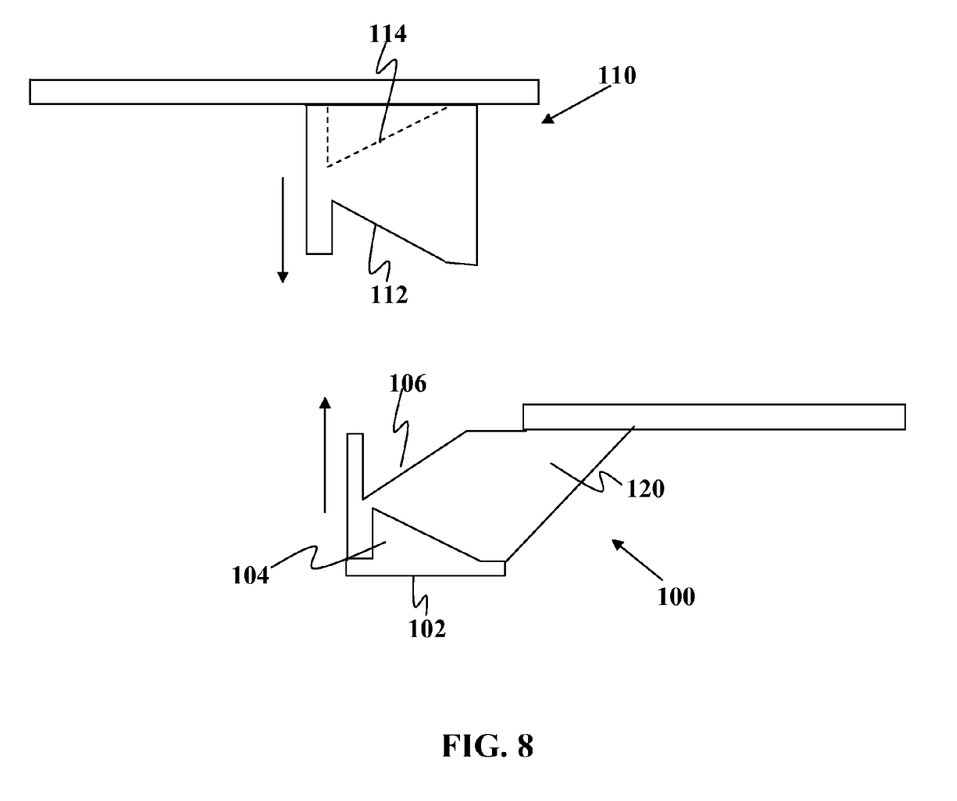

Referring now to FIG. 8, a side view of the brackets 100 and 110 are shown.

FIG. 8 shows that the brackets may be shaped to have appropriate mating cutouts and protrusions to prevent them from pulling apart by forces in one axis. It should be understood, however, that the brackets 100 and 110 may still be separated by rotating and/or angling the brackets to disengage the cutouts and protrusions.

Figure 9:
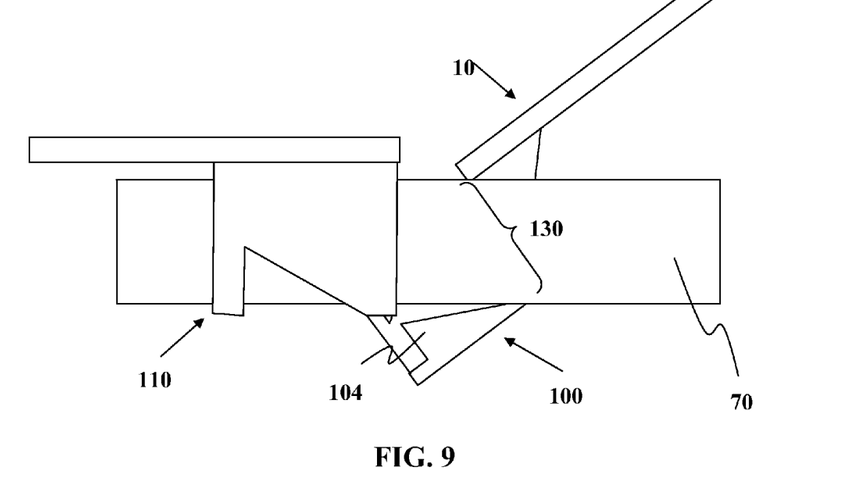

FIG. 9 shows how the brackets 100 and 110 are brought together to be engaged in a locking manner. As seen in FIG. 9, the bracket 100 along with module 10 is angled to clear the rail 70. In this embodiment, the gap 130 defined by the end of the protrusion 104 and the edge of module 10 is sufficient to allow the rail 70 to pass therethrough.

Figure 10:
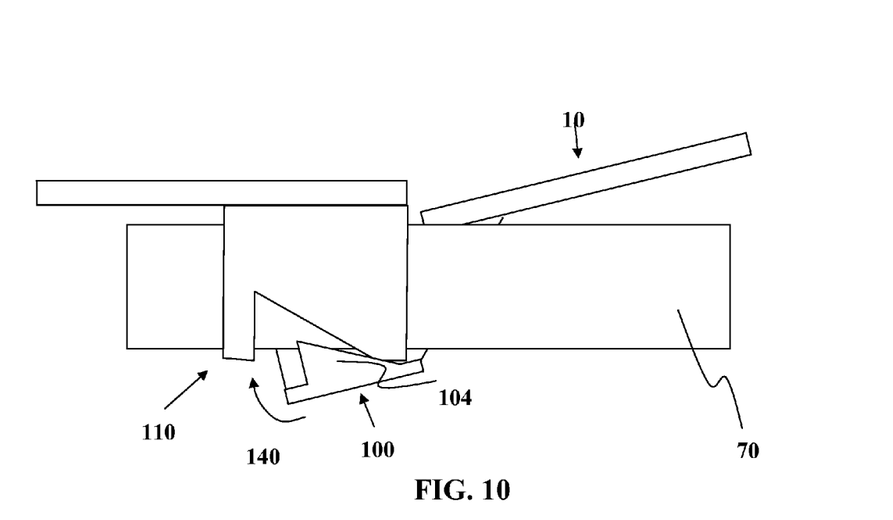

FIG. 10 shows that after the bracket 100 and protrusion 104 clears the underside of the rail 70, the bracket 100 along with module 10 is angled as indicated by arrow 140 to begin to engage the adjacent bracket 110. This rotation motion allows the protrusion 104 to slide into the cutout of bracket 100.

Figure 11:
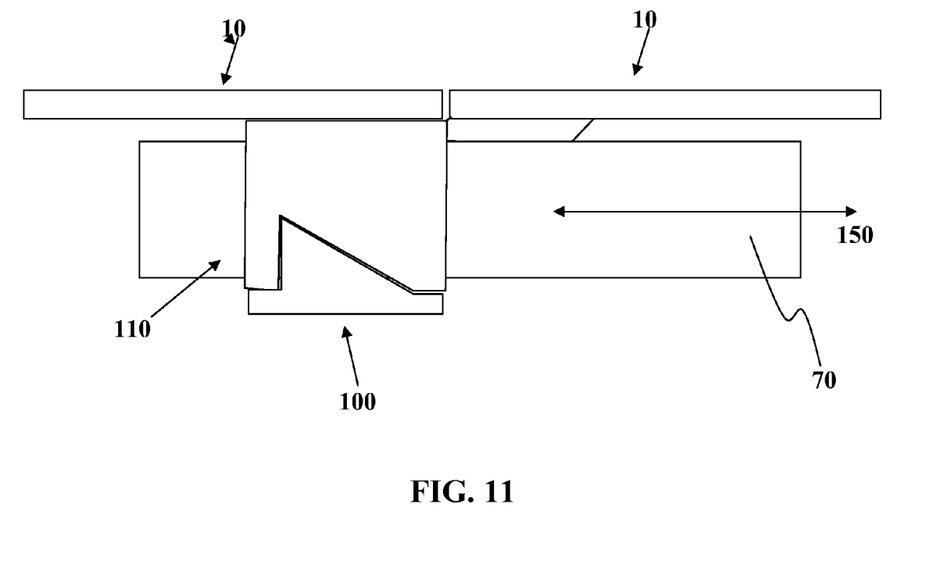

Referring now to FIG. 11, the brackets 100 and 110 are shown as fully engaged. This configuration resists compression and tension forces in the longitudinal axis (indicated by arrow 150) of the rail 70. Once locked together, this allows multiple modules 10 to be slidably moved together. It also allows a single anchor point to secure multiple modules to the rail 70 since the modules 10 are interlocked. In other embodiments, multiple anchors may be used to secure brackets to the rail 70, but again, not every bracket need be anchored to the rail due to the interlocking feature. Forces or stress from out of the plane of longitudinal axis 150 may be used to disengage the brackets 100 and 110.

Figure 12:
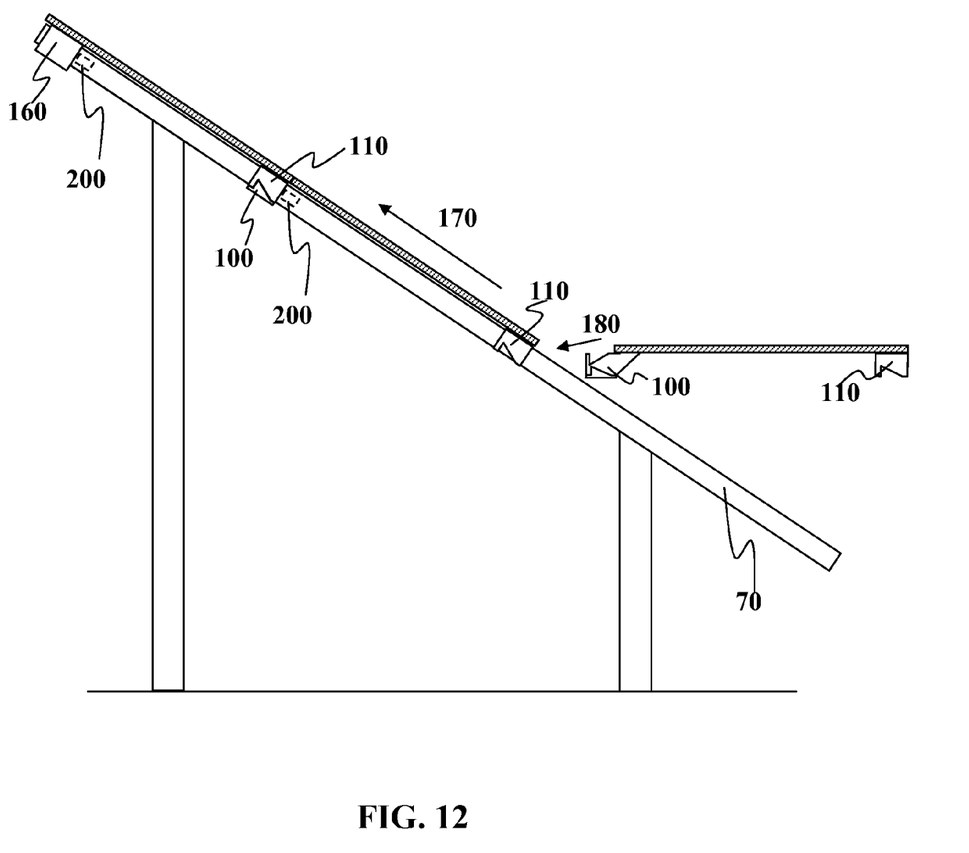
FIG. 12 shows one example of how brackets according to one embodiment of the present invention can engage a module mounting structure.

FIG. 12 shows how the brackets 100 and 110 may be used with a plurality of modules 10 to mount to rails 70 that are inclined. It should be understood that the brackets may also be used on brackets that are inclined at other angles or horizontal. In this embodiment, each of the modules, except the top most module, will have a bracket 100 and a bracket 110. The top most module has an end bracket 160 that may be a U-shaped bracket, C-shaped bracket, L-shaped bracket, or the like to allow it to engage the rail 70 without having to mate with another bracket. There may be two or more rails 70 to engage each module, but for ease of illustration, only one is shown from this perspective in FIG. 12. Arrow 170 shows that once the modules are connected, that may be slidably moved as indicated by arrow 170 to make space to allow another module to be placed into position as indicated by arrow 180. This allows modules to be mounted to the very top of the rail 70 by way of a loading system that only loads from the bottom or other areas reachable without ladders or special equipment to reach higher locations on rail 70. This loading at the bottom allows for larger modules to be mounted as they may be mounting without having to lift them to their final position prior to attachment to the rail 70. The module is instead loaded onto the rail 70 at a reasonable height and then pushed up into position.

Furthermore, retractable wedges 200 (shown in phantom) may optionally be positioned to allow the modules to move in a one-way manner up the rail 70, but prevent them from back sliding. The wedges may be formed or fixed onto the rail and the brackets slide and flex over each wedge when moved upward. However, downward motion of the modules is prevented by the flat surface of the wedge. Other embodiments, may used spring loaded wedges that retract into the rail 70 when the brackets 100 or 110 pass over them, but then spring back out are the brackets pass. Again, these act as one-way devices to prevent back sliding of the modules as they are raised on rail 70. These ratchet mechanisms on rails 70 may engage each bracket, only one bracket, or multiple but not all brackets.

Figure 13:
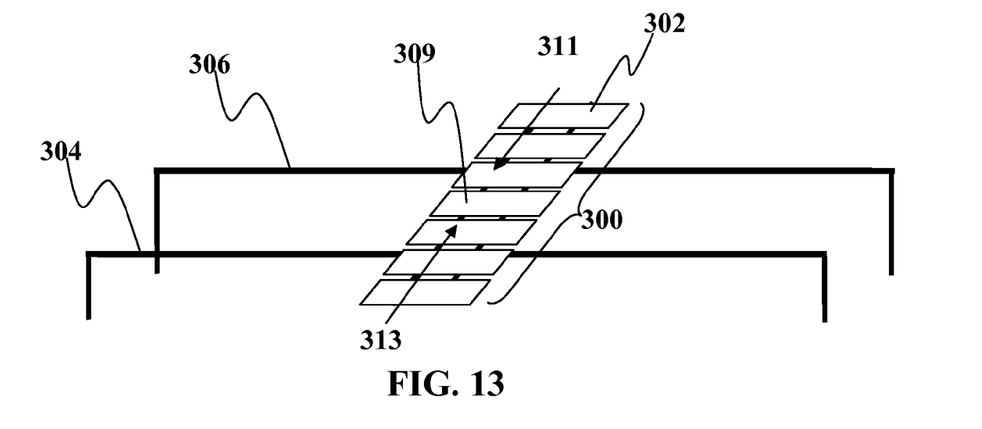
FIGS. 13-15 show systems according to embodiments of the present invention.

Referring now to FIG. 13, a still further embodiment of the present invention will now be described. FIG. 13 shows a solar assembly segment 300 comprised of a plurality of solar modules 302. The solar assembly segment 300 may be mounted on support beams or rails 304 and 306 that are mounted over the ground, a roof, or other installation surface. The rails 304 and 306 may be similar to rail 70 of FIG. 12. This shows that each of the modules 302 may engage two rails. Thus, there may be two sets of brackets 100 and 110 per module. The number of brackets per modules may also be varied based on the number of rails. Some embodiments, may only have a zig-zag or alternating pattern with the brackets, using only one bracket per rail. This may reduce the number of brackets used per module.

Additionally, the brackets 100 and 110 may be secured to the rails at a single location or multiple locations. In one embodiment, the anchor position may be under module 309. This middle module helps to reduce the amount of force being support by each rail. By anchoring in the middle, the modules about the module 309 are in compression as indicated by arrow 311. Modules below are in tension as indicated by arrow 313. Of course, it should be understood that other modules may also be anchored in addition to or in place of anchors for module 309. By way of example and not limitation, one embodiment may secure every other module. Other embodiments may secure only every third module. Some embodiments may secure only the bottom module(s). Some embodiments may secure only the bottom two modules. Some embodiments may secure only the bottom three modules. The securing may involve the use of bolts or screws into the brackets 100 and 110 and the rail. It should be understood that other fastening devices as known to those of skill in the art may also be used. Typically, it is easier to secure those modules within reach of the installation crew, without the use of ladders or specialty equipment. The securing may occur from the underside of the module by a worker beneath the rails. In some embodiments, two or more workers are used to lift the modules in place. In other embodiments, pushing equipment or powered lifting or pushing equipment can be used to push the entire stack of modules up the rail during assembly. Those rails with ratchet mechanism may allow for the modules to be held in place while the next module is prepared to be laid into position.

Figure 14:
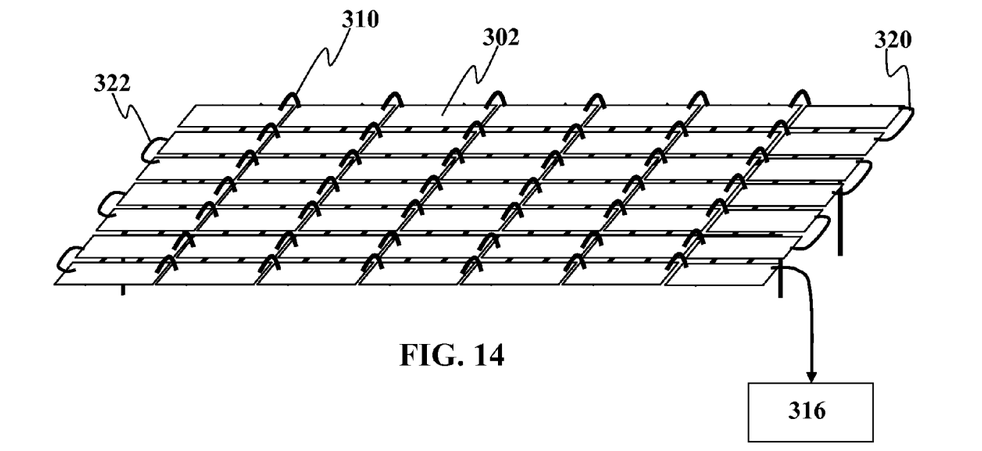

FIG. 14 shows yet another embodiment wherein each row of modules 302 is coupled in series and then the entire row is then coupled in series at one end by connector 320 to an adjacent row of modules 302. Connectors 322 may be used at the other end of the row to serially connect modules 302 to the next row of modules. All of the modules may be coupled in series and then finally coupled to an inverter 316. Alternatively, one or more rows may be coupled in series, but not all the rows are electrically coupled together. In this manner, groups of rows are serially connected, but not all the modules in the entire installation are serially connected together. By way of example and not limitation one or more of the modules 302 may be secured using brackets that interlock together. It should also be understood that one or more columns of the modules may be interlocked together using similar locking brackets. Optionally, it should also be understood that one or more columns of the modules may be interlocked together using similar locking brackets.

Figure 15:
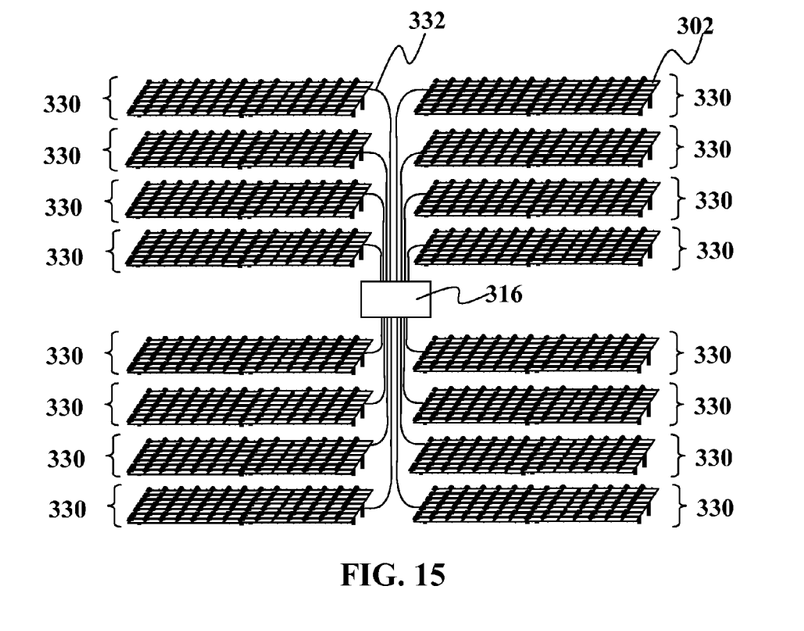

FIG. 15 shows that multiple groups 330 of modules 302 may be coupled together to a single inverter at a single location. Although not limited to the following, inverters are generally rated to handle much more capacity than the output of a group 330 of modules 302. Hence, it is more efficient to couple multiple groups 330 of modules 302 to a single inverter. This minimizes costs spent on inverters and more fully utilizes equipment deployed at the installation site. Cabling 332 is used to couple the groups 330 to the inverter 116.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, although glass is the layer most often described as the top layer for the module, it should be understood that other material may be used and some multi-laminate materials may be used in place of or in combination with the glass. Some embodiments may use flexible top layers or coversheets. By way of nonlimiting example, the backsheet is not limited to rigid modules and may be adapted for use with flexible solar modules and flexible photovoltaic building materials. Embodiments of the present invention may be adapted for use with superstrate or substrate designs. It should also be understood that some embodiments of the present invention are designed so that they can only be disengaged by movement in a downward motion of the bracket, which is typically prevented by the mounting structure it sits on. This one-way motion (be it downward, upward, or sideways) for disengagement prevents accidental uncoupling of panels. It should also be understood that the above embodiments are applicable to any type of solar panel and are not limited to glass-glass panels.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, organic oligomers or polymers (for organic solar cells), bilayers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, microparticles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, microcrystalline silicon cell architecture, randomly placed nanorods and/or tetrapods of inorganic materials dispersed in an organic matrix, quantum dot-based cells, or combinations of the above. Many of these types of cells can be fabricated on flexible substrates.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A photovoltaic module mounting system for use with a plurality of photovoltaic modules and support rails comprising:
   at least a first type of mounting bracket in contact with a first module, wherein the first type of mounting bracket has a first wall having a first edge, and wherein the first edge has a first interlocking feature; and
   at least a second type of mounting bracket coupled to and extending beyond the end of a second module to form an extension thereof, wherein the second type of mounting bracket has a second wall having a second edge, wherein the second edge has a second interlocking feature configured to interlock with the first interlocking feature and connect adjacent first and second modules together, wherein the first type of mounting bracket and the second type of mounting bracket mate together to form a channel for the support rail;
   wherein a vertical gap measured from the second edge to an underside of the second module has a gap height that is less than a height of the support rail, wherein the gap height is measured perpendicular to the axis of the support rail; and
   wherein the second type of mounting bracket has an opening which spans laterally across a width of the bracket, wherein the width has a lateral axis along a line that is at a non-parallel angle with respect to the support rail, and wherein the opening encompasses the extension of the second type of mounting bracket beyond the end of the second module.

2. The module of claim 1 wherein the interlock involves interlocking around a mounting structure which provides load carrying capacity for the module.

3. The module of claim 1 wherein the interlock involves bringing the first and second type of mounting brackets together to circumferentially surround one portion of the support rail.

4. The module of claim 1 wherein the first type of mounting bracket has a male design to engage the second type of mounting bracket which has a female design.

5. The module of claim 1 wherein the first interlocking feature of the first type of mounting bracket has a protrusion, and wherein the second interlocking feature has a cutout configured to mate with the protrusion when the second type of mounting bracket is parallel to and on the support rail.

6. The module of claim 5 wherein the protrusion and the cutout are configured to be disengaged when the second type of mounting bracket is at the non-parallel angle.

7. The module of claim 1 wherein the bracket is configured to slidably engage a mounting structure.

* * * * *